United States Patent
Chang et al.

(10) Patent No.: US 6,624,703 B1
(45) Date of Patent: Sep. 23, 2003

(54) TERMINAL ARRANGEMENT FOR AN ELECTRICAL DEVICE

(75) Inventors: Shiaw Chang, Thousand Oak, CA (US); Kevin Choi, Thousand Oaks, CA (US); Roger J. Forse, Santa Barbara, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 104 days.

(21) Appl. No.: 09/677,162

(22) Filed: Oct. 2, 2000

(51) Int. Cl.[7] .................................................. H03F 3/14
(52) U.S. Cl. .............................. 330/307; 330/66; 330/68
(58) Field of Search ............................... 330/65, 66, 68, 330/307; 361/772; 257/786

(56) References Cited

U.S. PATENT DOCUMENTS

| | | | | |
|---|---|---|---|---|
| 4,916,506 A | * | 4/1990 | Gagnon | 357/70 |
| 5,142,239 A | * | 8/1992 | Brayton et al. | 330/66 |
| 5,357,404 A | * | 10/1994 | Bright et al. | 361/818 |
| 5,627,495 A | * | 5/1997 | Halbert et al. | 330/307 |
| 5,939,781 A | * | 8/1999 | Lacap | 257/698 |
| 6,191,656 B1 | * | 2/2001 | Nadler | 330/290 X |
| 6,396,699 B1 | * | 5/2002 | Caldwell et al. | 361/772 |

* cited by examiner

Primary Examiner—Steven J. Mottola
(74) Attorney, Agent, or Firm—Thomas, Kayden, Horstemeyer & Risley

(57) ABSTRACT

This invention provides a terminal arrangement for an electrical device. The electrical device includes a ground terminal on its outer surface that has a relatively large surface area. The electrical device also includes a plurality of contact terminals that are arranged around the periphery of the outer surface. Preferably, these terminals are generally equally-spaced from each other. Where the outer surface is rectangular, a terminal is normally located in each corner and one or more terminals are located along a side between the corners. The electrical device can be, for instance, a power amplifier. In such an arrangement, the amplifier is used to receive a radio frequency signal at a first side of the outer surface and output an amplified radio frequency signal from a second side of the outer surface. The power used to operate the amplifier is provided by power supply signals that typically enter at outer surface corners. Normally, a voltage reference signal is also supplied to the amplifier at another outer surface corner.

28 Claims, 6 Drawing Sheets

TERMINAL ARRANGEMENT FOR AN ELECTRICAL DEVICE

BACKGROUND OF THE INVENTION

1. Field of the Invention.

This invention relates to a contact terminal arrangement for an electrical device such as a modular power amplifier.

2. Related Art.

As the demand for smaller electronic devices increases, so too does the demand for smaller and smaller electrical components used in these devices. One example of such components is power amplifiers that can be used, for instance, in mobile telephones. In one conventional arrangement, these power amplifiers comprise an integrated chip having width and length dimensions of approximately 8.3 millimeters (mm) and a thickness of approximately 2 mm. These power amplifiers normally comprise two conductive (e.g., silver) layers formed on opposite sides of a single piece of a dielectric material such as a ceramic material. Although the dimensions of these prior art power amplifiers are not large, device manufacturers have expressed interest in even smaller power amplifiers that would enable the design of smaller electronic devices. As is known in the art, reducing the size of electrical components can create design hurdles to overcome. In the power amplifier context, size reduction creates heat dissipation problems. In particular, the smaller the power amplifier, the more difficult it is to dissipate heat created by its operation. In addition, reduced size creates manufacturing difficulties. Specifically, the smaller the surface area of the amplifier the more difficult it is to form the electrical circuits that the amplifier comprises. In addition, size reduction creates assembly and connection problems for electronic device manufacturers who purchase the power amplifiers. In particular, the small size of power amplifiers can make it difficult for the manufacturers to make the various necessary electrical connections between the power amplifier and other components such as printed circuit boards (PCBs). Thus, a need exists for a modular power amplifier having reduced size that avoids these problems.

SUMMARY OF THE INVENTION

This invention provides a terminal arrangement for an electrical device that is adapted for electrical connection to another electrical component. The electrical device includes a ground terminal on its outer surface that has a relatively large surface area so as to form a heat sink suitable for dissipating heat generated by the electrical device. The electrical device further includes a plurality of contact terminals that are arranged around the periphery of the outer surface. Preferably, these terminals are generally equally-spaced from each other. Where the outer surface is rectangular, a terminal is normally located in each corner and one or more terminals are located along a side between the corners.

The electrical device can be, for instance, a power amplifier. In such an arrangement, the amplifier can be used to receive a radio frequency signal at a first side of the outer surface and output an amplified radio frequency signal from a second side of the outer surface. The power used to operate the amplifier is provided by power supply signals that typically enter at outer surface corners. A voltage reference signal is also supplied to the amplifier normally at another outer surface corner.

Other systems, methods, features, and advantages of the invention will be or will become apparent to one having ordinary skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. Moreover, in these figures, like reference numerals designate corresponding parts throughout the different views.

DETAILED DESCRIPTION OF THE DRAWINGS

Figure 1:
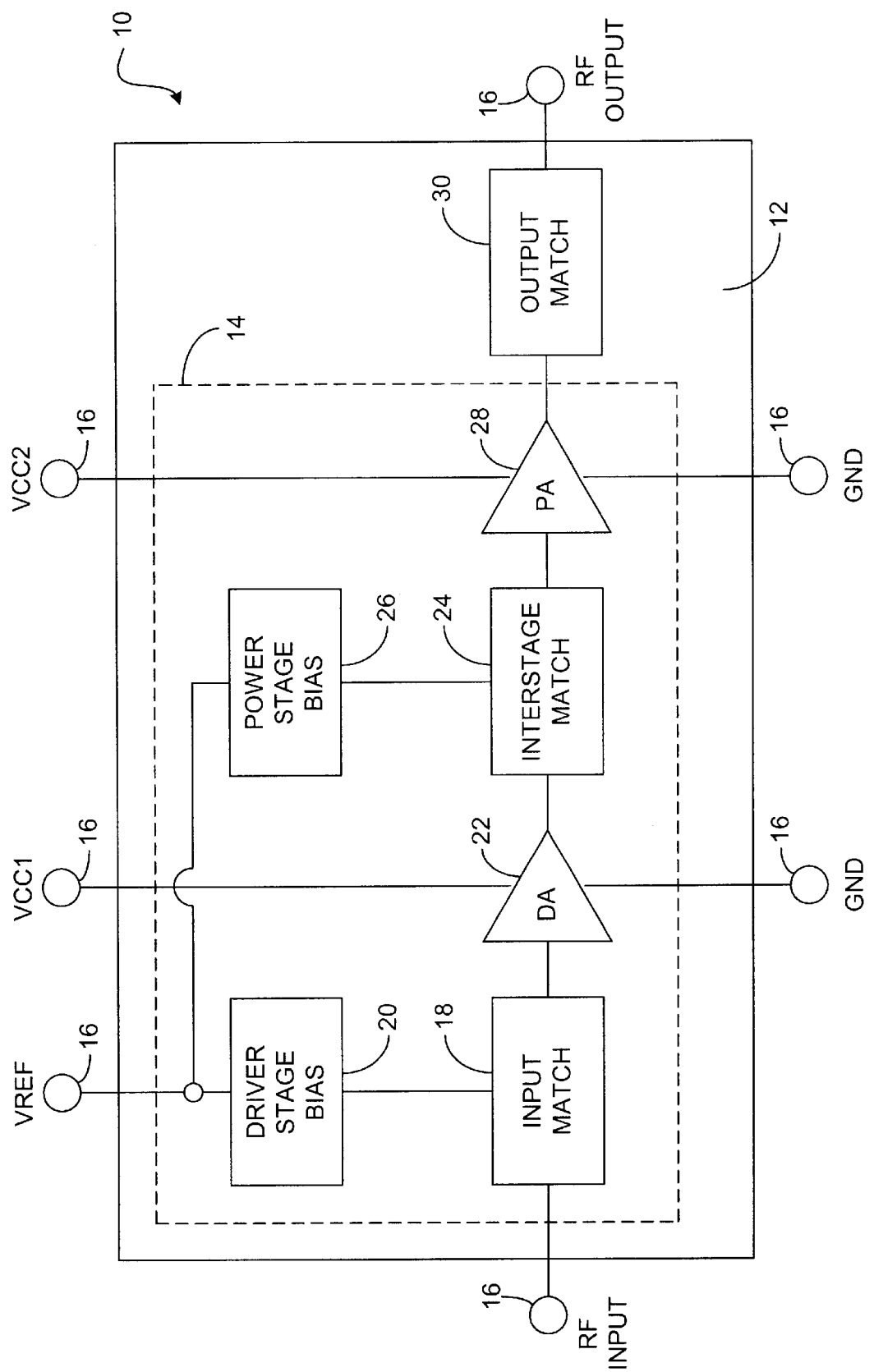
FIG. 1 is a functional block diagram of a power amplifier.

FIG. 1 illustrates a functional block diagram of a power amplifier 10 of the invention. The power amplifier 10 is of a generally modular construction. Accordingly, the power amplifier 10 typically comprises a printed circuit board (PCB) 12 that includes a plurality of conductive layers, and a separate integrated circuit (IC) 14 that is electrically connected to the PCB 12. In a preferred arrangement, the IC 14 is mounted on the top surface of the PCB 12.

As indicated in FIG. 1, the PCA 12 comprises a plurality of contact terminals 16 such that the power amplifier 10 can be electrically connected to other electrical components (e.g., a printed circuit board) within an electronic device (e.g., a mobile telephone). The various terminals 16 can be dedicated to serve as a radio frequency (RF) input, an RF output, a reference voltage (VREF), power supplies (VCC1 and VCC2), and at least one ground (GND) as identified in FIG. 1. The IC 14 normally comprises a plurality of electrical subcomponents that are used to amplify the RF signals that enter the power amplifier 10. By way of example, the IC 14 can comprise a microwave monolithic integrated circuit (MMIC) that comprises a plurality of transistor circuits (not shown) that are used to amplify the RF signals. This MMIC can, for instance, be surface mounted to the PCB 12, if desired. As will be appreciated by persons having ordinary skill in the art, the particular design of the IC 14 can take many different forms depending upon the output characteristics and modulation scheme desired. The design of the PCB 12 accounts for the design variations of the IC 14 to standardize connection of the amplifier to other electrical components. Accordingly, irrespective of the particular configuration of the IC 14, the power amplifier preferably has the same terminal configuration. With further reference to FIG. 1, the IC subcomponents typically include an input match 18, a driver stage bias 20, a driver amplifier 22, an inter-stage match 24, a power stage bias 26, and a power amplifier 28.

In use, an RF signal enters the power amplifier 10 through the terminal 16 (RF input) shown at the left side of the amplifier in FIG. 1. Where the power amplifier is used in a wireless device, this signal comprises a modulated radio frequency signal comprising voice and data that is to be amplified and transmitted to an appropriate receiver. The RF signal travels to the input match 18 that transforms the impedance level of the RF input to match the impedance of the driver amplifier 22. For example, the RF input may have an initial impedance of approximately 50 ohms (Ω), whereas the driver amplifier 22 may have an impedance of approximately 30 Ω. The direct current (DC) bias of the driver amplifier 22 is controlled with the reference voltage, VREF, that enters the power amplifier 10 through the terminal 16 at the upper left corner of the amplifier in FIG. 1. As is known in the art, the reference voltage is typically used to set the proper operating conditions of the power amplifier 10. This voltage passes through the driver stage bias 20 that contains bias circuitry that sets the bias delivered to the driver amplifier 22. The driver amplifier 22 boosts the power of the RF signal to give it a predetermined gain. Normally, the driver amplifier 22 acts as a pre-amplifier that works in conjunction with the power amplifier 28. As indicated in FIG. 1, the driver amplifier 22 receives its DC power from the power supply VCC1.

After the RF signal leaves the driver amplifier 22, it enters the inter-stage match 24. Similar to the input match 18, the inter-stage match 24 transforms the impedance from that of the driver amplifier 22 to an impedance that is appropriate for the downstream amplifier, in this case the power amplifier 28. By way of example, the power amplifier 28 may have an input impedance of approximately 5 Ω. Therefore, the inter-stage match 24 may transform the impedance from approximately 30 Ω to 5 Ω. Also like the input match 18, the inter-stage match 24 is supplied with the reference voltage (VREF). However, this reference voltage is directed to the power stage bias 26 that sets the bias for the power amplifier 28. The power amplifier 28 is supplied with DC power through VCC2.

As is further indicated in FIG. 1, the power amplifier 10 can also include an output match 30 that receives the amplified RF signal from the IC 14. The output match 30 transforms the impedance level of the circuit to an appropriate level for output from the PCA 12 through the contact terminal 16 indicated at the right side of the power amplifier 10 in FIG. 1. Normally, the output match 30 transforms the impedance such that it will be approximately equal to the initial impedance of the RF signal as it enters the power amplifier 10. Accordingly, as an example, the output match 30 may transform the signal to have an impedance of approximately 50 Ω.

Figure 2:
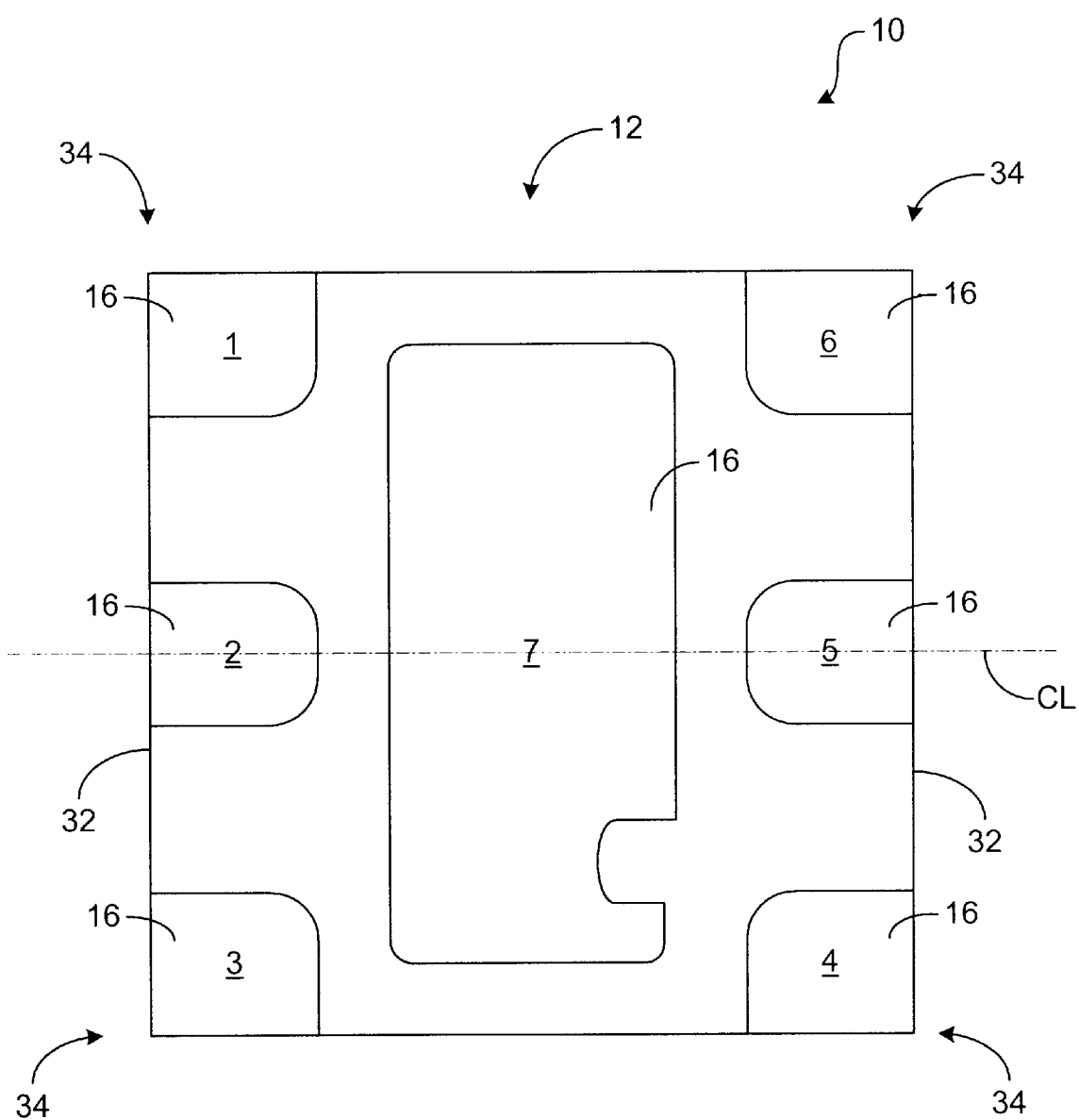
FIG. 2 is a plan view of example terminal locations of the power amplifier shown in FIG. 1.

FIG. 2 illustrates an example terminal, or pin-out, arrangement for the inputs and outputs to and from the power amplifier 10. As is identified in this figure, the amplifier 10 can be provided with a total of seven contact terminals 16 that, by way of example, can be provided on a bottom surface of the PCA 12. Normally, each terminal 16 comprises a contact pad that is composed of a highly conductive metal material such as copper. In a preferred arrangement, the terminals are used to transmit the signals identified in Table I.

TABLE I

Terminal Usage

| TERMINAL | SIGNAL |
|---|---|
| 1 | VCC1 |
| 2 | RF Input |
| 3 | VREF |
| 4 | VCC2 |
| 5 | RF Output |
| 6 | GND |
| 7 | GND |

Although the terminal arrangement shown in Table I is preferred, it will be understood that many alternative arrangements are feasible. Regardless of the particular terminal configuration used, however, it is desired that a standardized terminal arrangement is used so that electronic device manufacturers receive power amplifiers 10 that have a standardized layout.

Assuming the terminal arrangement identified in Table I, terminal 7 serves as a ground that is positioned generally in the center of the power amplifier 10. Normally, terminal 7 occupies a relatively large surface area, for instance approximately one-third of the total available surface area, so as to form a heat sink that is used to dissipate heat generated by the power amplifier 10. By way of example, terminal 7 can have a surface area of approximately 12 sq. mm. As is further indicated in FIG. 2, the remaining terminals 1–6 are preferably positioned about the periphery of the power amplifier 10 in a generally equally-spaced relationship. The positions of these terminals are arranged such that the power amplifier 10 maintains RF symmetry so as to reduce losses that can be sustained by the power amplifier. To achieve this RF symmetry, the RF terminals 2 and 5 normally are arranged along a center line, CL, of the power amplifier 10. For instance, as indicated in FIG. 2, terminals 2 and 5 can be arranged in the centers of opposing sides 32 of the power amplifier 10. In addition to providing for RF symmetry, this arrangement further facilitates connection of the power amplifier 10 to another electrical component (e.g., a mobile telephone PCB) in that such components normally comprise an RF input and output that are arranged along the same line. This arrangement therefore avoids crossing of the voltage signals with the RF signals that can further increase loss.

As indicated in FIG. 2, terminals 1, 3, 4, and 6 can each be positioned in corners 34 of the power amplifier 10. Again, symmetry is maintained through the positioning of these terminals. For instance, VCC1 is positioned along the same line as the ground of terminal 6. Generally speaking, the relative positions of each of the terminals shown in FIG. 2 maximizes their relative separation on the amplifier 10 to facilitate handling and connection of the amplifier. This separation of the terminals is particularly important where the power amplifier 10 is very small. For instance, the power amplifier 10 may have a footprint of approximately 6 mm by 6 mm.

Figure 3:
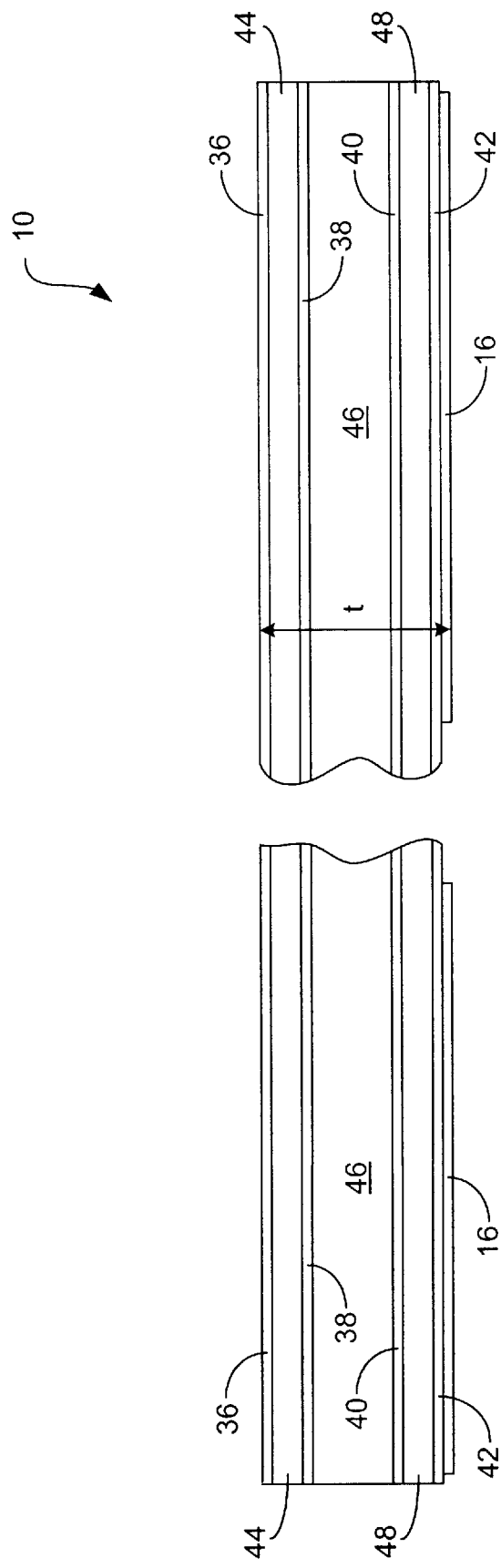
FIG. 3 is a side view of the PCB shown in FIG. 1 illustrating an example layer configuration.

The general construction and operation of an example embodiment of the power amplifier 10 will now be provided with reference to FIGS. 3–7. In particular, FIG. 3 shows an example PCB 12 arrangement and FIGS. 4–7 illustrate example conductive layer configurations that can be used in forming the PCA. The power amplifier 10 typically comprises a plurality of conductive layers. A plurality of layers may facilitate the reduction in size of the power amplifier 10 by routing the power signals through the power amplifier in layers other than the top layer. For instance, as illustrated in FIG. 3, the power amplifier 10 can comprise four conductive layers 36–42 that are separated by three layers 44–48 of dielectric material. Normally, each of the dielectric layers 44–48 is constructed of a polymeric material, for instance, an epoxy material.

In addition to the reduced length and width dimensions identified above, the power amplifier 10 preferably is also smaller in thickness than conventional power amplifiers. For instance, the power amplifier 10 shown in FIG. 3 can have a thickness t of approximately 1.5 mm as compared to the approximately 2 mm thickness of conventional 8 mm×8 mm amplifiers. Each conductive layer typically comprises a metal material that is deposited on the dielectric layers through conventional fabrication methods. For instance, the conductive layers can be formed on their respective dielectric layers by depositing a foil across the entire surface area of the dielectric layers, and etching away excess material (e.g., through photolithography) to form the desired electrical pathways of each conductive layer. By way of example, each conductive layer can have a thickness of approximately 12 microns ($\mu$m). As will be appreciated by persons having ordinary skill in the art, this dimension, although very small, is relatively large by semiconductor standards. This relatively large thickness dimension is desirable in that less resistance is created in each pathway so as to reduce loss.

To ensure the desired thickness of the power amplifier 10, each dielectric layer typically is very thin. By way of example, the center dielectric layer 46 can have a thickness of approximately 200 $\mu$m while the outer two layers 44 and 48 can have a thickness of approximately 70 $\mu$m. Once each of the conductive layers 36–42 has been formed on the dielectric layers 44–48, the power amplifier 10 can be encapsulated with, for instance, a polymeric material (not shown) to protect the amplifier and prevent it from short circuiting.

Figure 4:
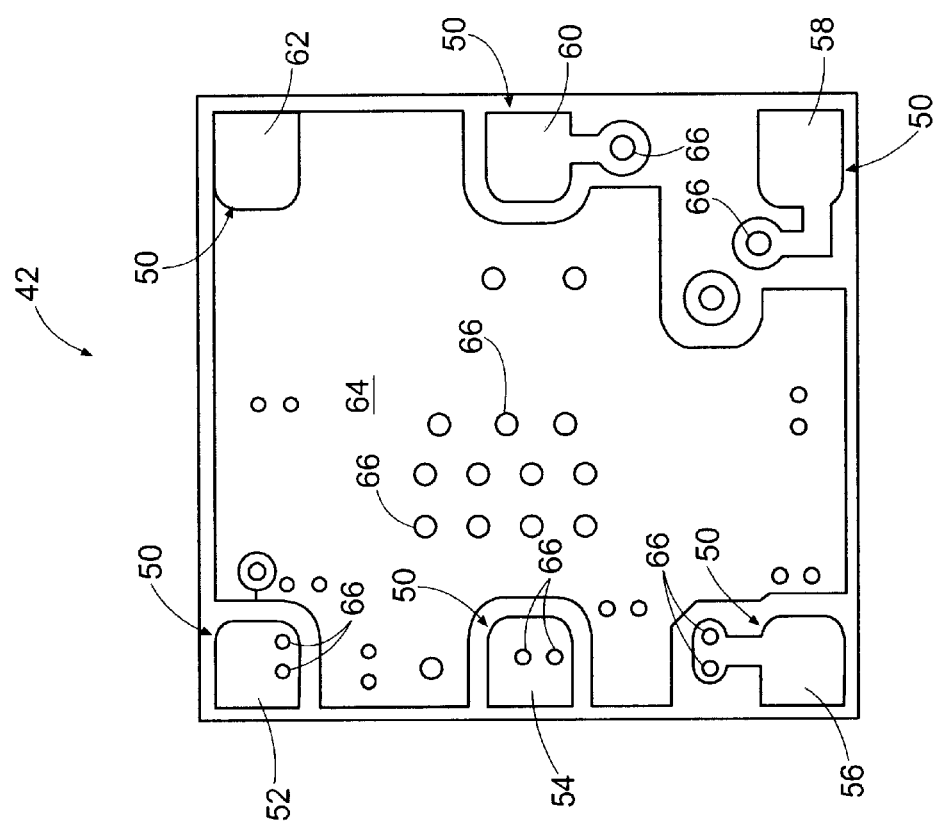
FIG. 4 is a plan view of a fourth conductive layer of the power amplifier shown in FIG. 1.

FIGS. 4–7 illustrate example layer arrangements for conductive layers 42, 40, 38, and 36, respectively. The description of these layers begins with FIG. 4 that illustrates the fourth or bottom layer 42, and continues through FIGS. 5–7 with regard to the other layers. Notably, a description is not provided for each and every feature shown in these figures, emphasis instead being placed upon the primary features of each layer. As illustrated in FIG. 4, the fourth layer 42 of the power amplifier 10 comprises a plurality of conductive areas 50 that correspond to various contact terminals 16 identified in FIG. 2. In particular, conductive areas 52, 54, 56, 58, 60, and 62 correspond to terminals 1, 2, 3, 4, 5, and 6, respectively. Accordingly, each of the conductive areas 50 are in electrical contact with these contact terminals 16 (FIG. 2) provided on the bottom of the power amplifier 10.

In addition to the conductive areas 50 is a relatively large conductive area 64 that covers a substantial portion of the fourth layer 42. By way of example, the conductive area 64 can occupy approximately 20 sq. mm. As indicated in FIG. 4, this relatively large conductive area 64 is electrically insulated from each of the conductive areas 50 except for conductive area 62 shown in the upper right corner in FIG. 4. Accordingly, conductive area 64 is in electrical contact with ground terminal 6 (FIG. 2). In addition, conductive area 64 is electrically connected to terminal 7 through a plurality of vias 66. In use, the conductive area 64 acts as a heat sink similar to terminal 7. As will be appreciated by persons having ordinary skill in the art, each of the conductive areas 52–60, as well as relatively large conductive area 64, electrically connects to the third layer 40 (FIG. 5) through vias 66. By way of example, each of these vias 66 can comprise a plated through hole (PTH) that delivers DC current or an RF signal from one layer to the next.

Figure 5:
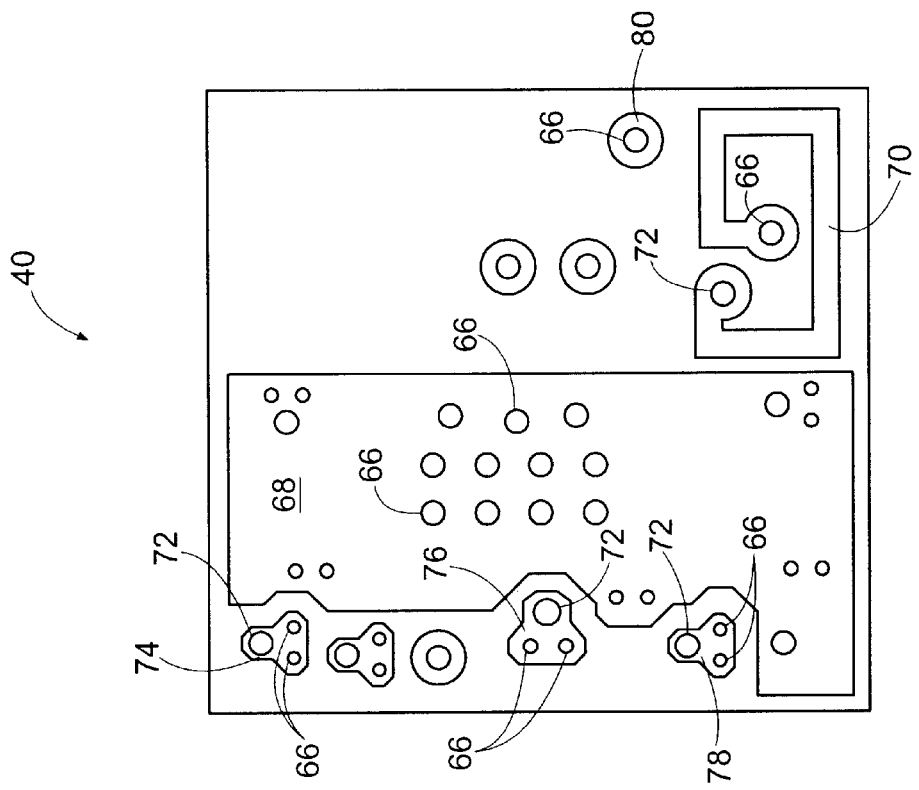
FIG. 5 is a plan view of a third conductive layer of the power amplifier shown in FIG. 1.
Figure 6:
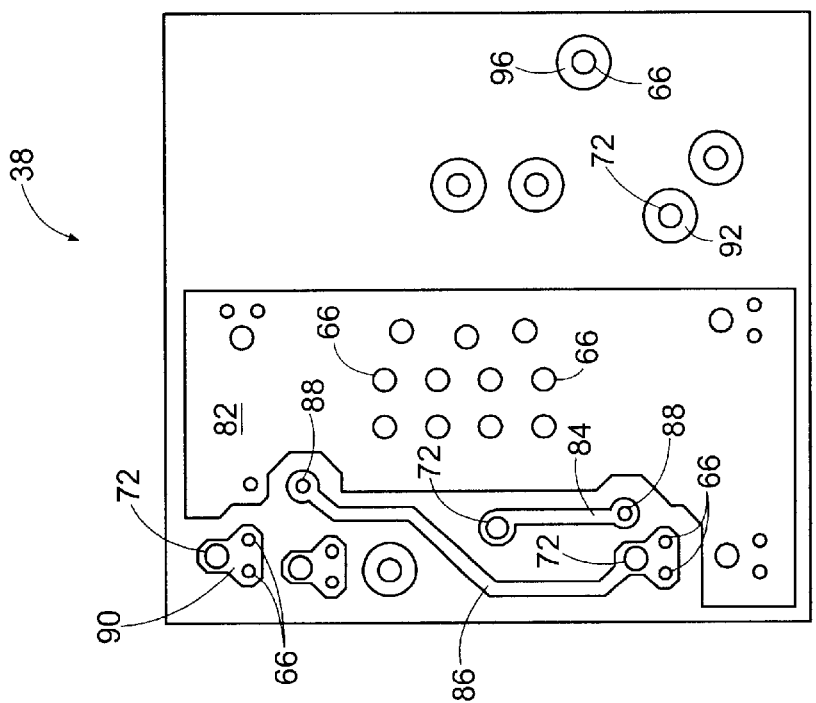
FIG. 6 is a plan view of a second conductive layer of the power amplifier shown in FIG. 1.

With reference to FIG. 5, the third layer 40 similarly comprises a relatively large conductive area 68 that, through vias 66, connects to ground (terminals 6 and 7) such that the area can similarly be used to dissipate heat produced by the power amplifier 10. In addition, the third layer 40 includes a conductive trace 70 that is electrically connected to conductive area 58 of the fourth layer 42 through one of the vias 66. This conductive trace 70 further includes a second via 72 through which the trace is connected to the second layer 38 (FIG. 6). As is further indicated in FIG. 5, the third layer 40 comprises various other conductive areas 74, 76, 78, and 80 that are electrically connected to areas 52, 54, 56, and 60, respectively, through vias 66. Similar to trace 70, conductive areas 74, 76, and 78, include an additional via 72 that connects these areas to the second layer 38.

Figure 7:
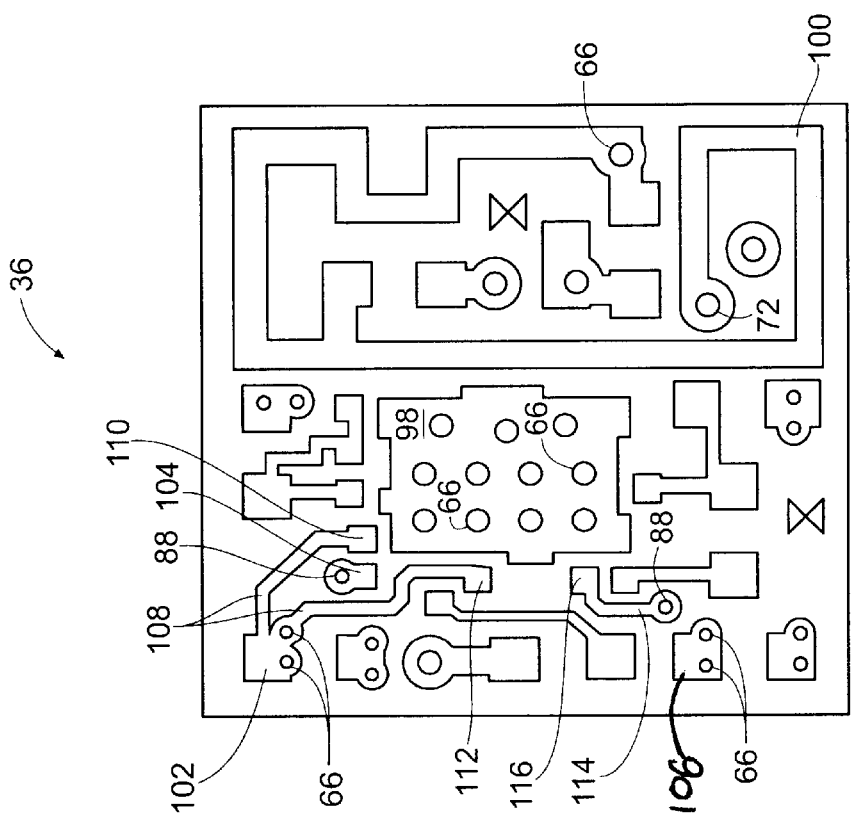
FIG. 7 is a plan view of a first conductive layer of the power amplifier shown in FIG. 1.

Turning to FIG. 6, illustrated is the second layer 38 of the power amplifier 10. The second layer 38 is also provided with a relatively large conductive area 82, for instance having an area of approximately 12 sq. mm, that is connected to ground through vias 66. Again, this area 82 acts as a heat sink for heat dissipation. In addition to conductive area 82, the second layer 38 includes first and second traces 84 and 86. As indicated in FIG. 6, each of these traces 84, 86 is connected to a via 72 and therefore is electrically connected to conductive areas 76 and 78 of layer 3 (FIG. 5). Each trace 84, 86 is further connected to an additional via 88 through which these traces are connected to the first layer 36 (FIG. 7). The conductive traces 84 and 86 carry current from one position in the third layer 38 to a remote position on the layer so as to deliver its signal to an appropriate position on the first layer 38 (FIG. 7) for electrical connection to the IC 14. In addition to traces 84, 86, various conductive areas 90, 92, and 94 are provided on the second layer 36 that are connected to conductive areas 74, 70, and 80, respectively, provided on the third layer 38.

Turning to FIG. 7, illustrated is the first or top layer 36 of the power amplifier 10. As indicated in this figure, the majority of the radio frequency routing is provided in this layer. Included in this layer 36 is a relatively large conductive area 98 that provides a mounting area for the IC 14 identified in FIG. 1 (see also FIG. 8). Further included on the first layer 36 is an serpentine conductive trace 100 that, by way of via 72, connected to trace 70 of the third layer 40. In addition, the serpentine conductive trace 100 is electrically connected to conductive area 60 of the fourth layer 42 through a via 66. Together, the traces 70 and 100 form at least portion of the output match 30 identified in FIG. 1. Normally, the trace 100 is positioned outside of the mounting area used by the IC 14 to reduce loss and ensure satisfaction of IC specifications.

In addition to the conductive trace 100, the first layer 36 includes conductive areas 102 and 104 that are electrically connected to conductive area 90 and conductive trace 86, respectively, through vias 66 and 88, respectively. Conductive trace 86 is also connected to conductive area 106 through vias 66. As indicated in FIG. 7, conductive area 102 includes elongated traces 108 that extend outwardly therefrom and terminate in contact pads 110 and 112. The first layer 36 further includes a conductive trace 114 that electrically connects to trace 84 of the second layer 38 through via 88. The trace 114 similarly terminates in a contact pad 116.

Operation of the power amplifier 10 and the current and signal flow through the amplifier will now be discussed. With reference to FIGS. 2 and 4–7, the RF signal enters the power amplifier 10 through terminal 2 and travels to conductive area 54 of the fourth layer 42. From the area 54, the signal travels along vias 66 to the third layer 40 of the amplifier to conductive area 76. From there, the signals travel along vias 66 and 72 to the conductor trace 84 provided in the second layer 38. The RF signal travels along this trace 84 (downward along the trace in FIG. 6) to via 88 through which the signal passes to conductor trace 114 provided in the first layer 36. Once reaching this conductor trace 114, the RF signal travels (upward along the trace in FIG. 7) to contact pad 116. As indicated in the power amplifier plan view shown in FIG. 8, the IC 14 mounted to the PCA 12 of the power amplifier 10 can connect to this contact pad 116 with a conductor member 118.

Figure 8:
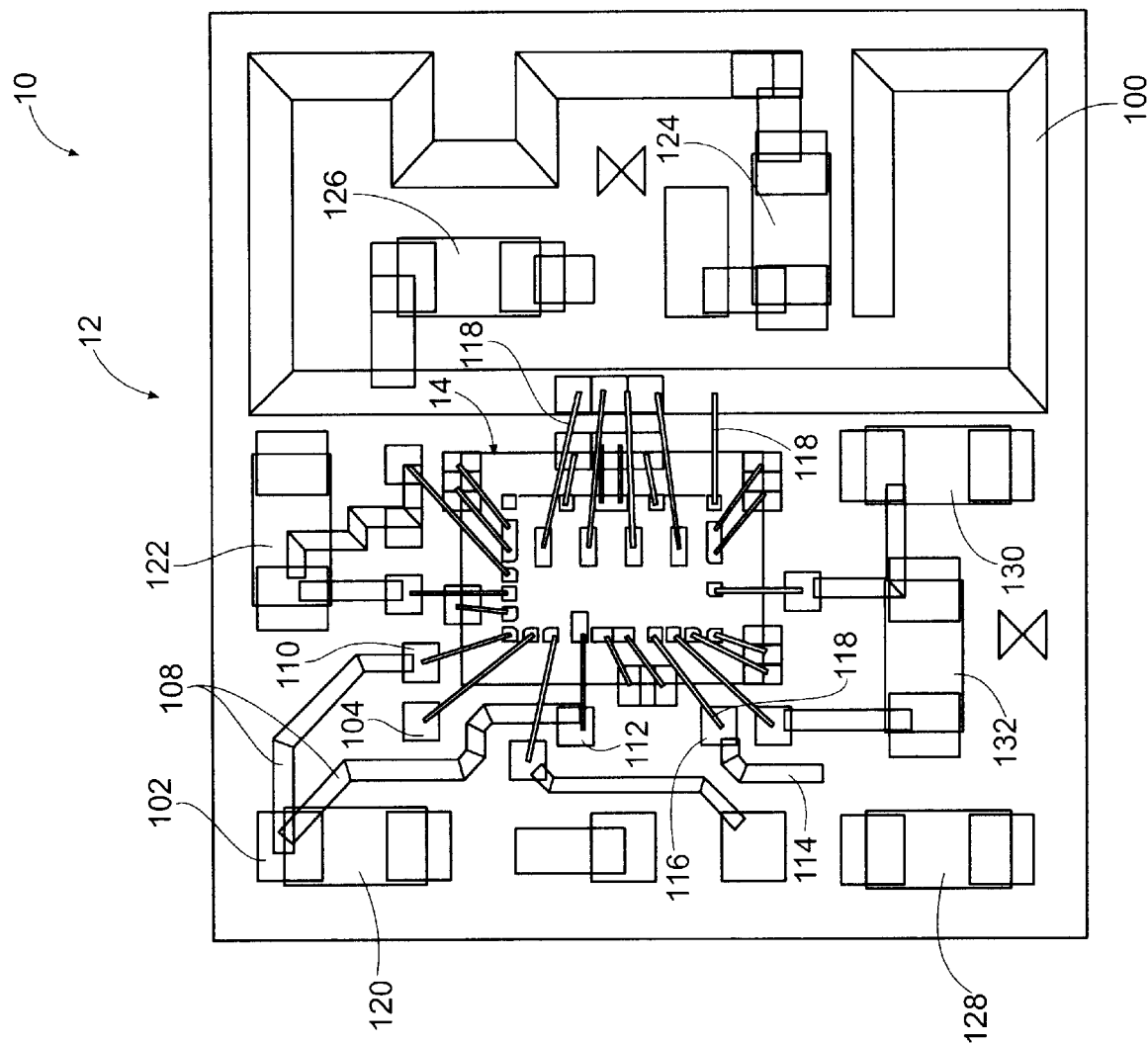
FIG. 8 is a plan view of the power amplifier shown in FIG. 1 illustrating electrical connections of an integrated circuit and various other electrical components within the power amplifier.

As will be appreciated by persons having ordinary skill in the art, the multiple layering, and lateral displacement of the RF signal in the second and third layers 36 and 38, facilitates construction of a reduced size power amplifier in that this displacement need not be provided for in the first or top layer, thereby permitting a smaller footprint than that of a single layer circuit board. As indicated in FIG. 8, a plurality of these conductor members 118 can be provided to electrically connect the IC 14 to various subcomponents provided on the first layer 36 of the power amplifier 10. By way of example, each of the conductor members 118 can comprise a bond wire that has been formed on the first layer 36 through a wire bonding technique. The RF signal from contact pad 116 can travel through the conductor member 118 into the IC 14 for amplification as described in reference to FIG. 1.

After being amplified by the IC 14, the RF signal exits the IC through one or more conductor members 118 that are electrically connected to the serpentine conductive trace 100 formed in the first layer 36 of the power amplifier 10. The RF signal travels along the trace 100 and through via 66 so that the now amplified RF signal can travel through the PCB 12 down to terminal 5. As is also indicated in FIGS. 4–7, a DC power VCC2 from terminal 4 travels up through conductive area 58 (layer 42), conductive trace 70 (layer 40), conductive area 92 (layer 38), to the serpentine conductive trace 100 formed in the first layer 36 to power the power amplifier 28 shown in FIG. 1.

In addition to VCC2, operating power for the power amplifier 10 is also provided with VCC1 that enters the power amplifier through terminal 1. The VCC1 current flows from terminal 1 to conductive area 52 formed in the fourth layer 42 and through via 66 to conductive area 74 provided in the third layer 40. From there, the VCC1 current then travels up through vias 66 and through via 72 to pass to a conductive area 90 formed in the second layer 38. The VCC1 current then flows through via 66 and is delivered to conductive area 102 provided in the first layer 36 of the power amplifier 10. Once reaching area 102, this current travels along the conductive traces 108 to arrive at contact pads 110 and 112, respectively. From there, the VCC1 current can be delivered to the IC 14 through conductive members 118 as indicated in FIG. 8.

As for the reference voltage, the VREF signal enters the power amplifier 10 through terminal 3 and passes on to conductive area 56 of the fourth layer 42. From there, the VREF signal passes through vias 66 into conductive area 78 formed in the third layer 40. The VREF signal travels up through vias 66 into the second layer 38, and through via 72 provided in third and second layers 40 and 38 to reach the conductive trace 86 provided in the second layer. The VREF signal travels along this trace 86 (upward along the trace in FIG. 6) to via 88 provided at a distal end of the trace so that the VREF signal passes through the via to conductive area 104 provided in the first layer 36. Again, this lateral displacement of the VREF signal facilitates miniaturization of the power amplifier 10. As indicated in FIG. 8, the VREF signal then passes into IC 14 through one of the conductor members 118.

With further reference to FIG. 8, additional electrical subcomponents can be provided on the first layer 36 in addition to IC 14. For instance, a plurality of capacitors 120, 122, 124, 126, 128, and 130 can be mounted to the first layer 36 and electrically connected to various conductive areas and/or traces provided therein. In addition, the power amplifier 10 can further include an inductor 132 that is similarly mounted to the first layer 36. As will be appreciated by persons having ordinary skill in the art, by providing of the subcomponents outside of the IC 14 the internal coupling that normally results from large on-IC inductors and radiation from large on-board bypass capacitors is minimized, thereby improving overall power amplifier performance. The size reduction/cost reduction trade-off is maximized in that single layer on-IC capacitance would require a relatively large area while discreet multilayer capacitors are considerably smaller and less expensive. In addition, this arrangement simplifies the design of the IC in that the IC need not comprise these various other components internally. Accordingly, provision of these subcomponents greatly simplifies the design of the IC 14 and, therefore, the power amplifier 10.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A power amplifier, comprising:
   an outer surface; and
   a plurality of contact terminals arranged on the outer surface including a ground terminal having a relatively large surface area arranged substantially in the center of the outer surface and a plurality of terminals arranged around the periphery of the outer surface in a substantially equally-spaced relationship, wherein the outer surface is defined by four sides and four corners, wherein a contact terminal is located adjacent each of the four corners, and wherein the contact terminals located adjacent the four corners include a reference voltage terminal and at least one power supply terminal.

2. The amplifier of claim 1, wherein the ground terminal occupies approximately one-third of the surface area of the outer surface.

3. The amplifier of claim 1, wherein the ground terminal is approximately 12 sq. mm in surface area.

4. The amplifier of claim 1, wherein the contact terminals located adjacent the four corners further include a second ground terminal.

5. The amplifier of claim 1, wherein two contact terminals are arranged along two opposed sides of the outer surface.

6. The amplifier of claim 5, wherein the two contact terminals arranged along opposed sides are radio frequency input and output terminals.

7. The amplifier of claim 1, wherein the outer surface has a surface area of approximately 36 sq. mm.

8. A power amplifier, comprising:
   an outer surface; and
   means for electrically contacting the device arranged on the outer surface including means for electrically grounding the device having a relatively large surface area arranged substantially in the center of the outer surface, and portions of the means for electrically contacting device arranged around the periphery of the outer surface in a substantially equally-spaced relationship, wherein the outer surface is defined by four sides and four corners, wherein portions of the means for electrically contacting the device are located adjacent each of the four corners, and wherein the portions of the means for electrically contacting the device located adjacent the four corners include a reference voltage terminal and at least one power supply terminal.

9. The amplifier of claim 8, wherein the means for electrically grounding the device occupies approximately one-third of the surface area of the outer surface.

10. The amplifier of claim 8, wherein the means for electrically grounding the device is approximately 12 sq. mm in surface area.

11. The amplifier of claim 8, wherein the portions of the means for electrically contacting the device located adjacent the four corners further include a second ground terminal.

12. The amplifier of claim 8, wherein portions of the means for electrically contacting the device are arranged along two opposed sides of the outer surface.

13. The amplifier of claim 12, wherein the portions of the means for electrically contacting the device arranged along opposed sides are radio frequency input and output terminals.

14. The amplifier of claim 8, wherein the outer surface has a surface area of approximately 36 sq. mm.

15. A power amplifier, comprising:
   an outer surface having a plurality of sides and corners;
   a ground terminal arranged substantially in the center of the outer surface, the ground terminal having a relatively large surface area; and
   a plurality of contact terminals arranged on the outer surface along the sides of the outer surface in a substantially equally-spaced relationship including:
      first and second power supply terminals positioned at first and second corners of the amplifier, respectively, the first and second corners being arranged opposite of each other;
      a reference voltage terminal positioned at a third corner of the amplifier, the reference voltage terminal further being positioned along sides along where the power supply terminals are positioned;
      a radio frequency input terminal positioned between the first power supply terminal and the reference voltage terminal; and
      a radio frequency output terminal positioned opposite the radio frequency input terminal and along a side along where the second power supply terminal is positioned.

16. The amplifier of claim 15, wherein the ground terminal occupies approximately one-third of the surface area of the outer surface.

17. The amplifier of claim 15, wherein the ground terminal is approximately 12 sq. mm in surface area.

18. The amplifier of claim 15, wherein the outer surface is defined by four sides and four corners.

19. The amplifier of claim 18, wherein a contact terminal is located adjacent each of the four corners.

20. The amplifier of claim 15, further comprising a second ground terminal positioned at a fourth corner of the outer surface.

21. The amplifier of claim 15, wherein the outer surface has a surface area of approximately 36 sq. mm.

22. A power amplifier, comprising:
   a substantially rectangular outer surface having a plurality of sides and corners;
   first, second, third, fourth, fifth, and sixth contact terminals arranged around the periphery of the outer surface in a substantially equally-spaced relationship; and
   a seventh contact terminal arranged substantially in the center of the outer surface; wherein:
      the first contact terminal is a first power supply terminal located in a first corner and along a first side of the outer surface;
      the second contact terminal is a radio frequency input terminal located along the first side of the outer surface adjacent the first contact terminal;
      the third contact terminal is a reference voltage terminal located in a second corner and along the first side of the outer surface adjacent the second contact terminal;
      the fourth contact terminal is a second power supply terminal located in a third corner and along second and third sides of the outer surface;,
      the fifth contact terminal is a radio frequency output terminal located along the third side of the outer surface, the fifth contact terminal being arranged opposite the second contact terminal;
      the sixth contact terminal is a first ground terminal located in a fourth corner and along the third side of the outer surface; and
      the seventh contact terminal is a second ground terminal and occupies a relatively large portion of the area of the outer surface.

23. The amplifier of claim 22, wherein the ground terminal occupies approximately one-third of the surface area of the outer surface.

24. The amplifier of claim 22, wherein the ground terminal is approximately 12 sq. mm in surface area.

25. The amplifier of claim 22, wherein the outer surface has a surface area of approximately 36 sq. mm.

26. A method for operating a power amplifier including an outer surface, comprising:
   inputting a radio frequency signal into the amplifier at a first side of the outer surface;
   inputting a first power supply signal into the amplifier at a first corner of the outer surface;
   inputting a second power supply signal into the amplifier at a second corner of the outer surface, the second corner being arranged opposite the first corner;
   inputting a voltage reference signal into the amplifier at a third corner of the outer surface, the third corner sharing common sides with the first and second corners;
   amplifying the radio frequency signal input into the amplifier; and
   outputting an amplified radio frequency signal from the amplifier at a side arranged opposite the first side.

27. A power amplifier, comprising:
   an outer surface; and
   a plurality of contact terminals arranged on the outer surface including a ground terminal having a relatively large surface area arranged substantially in the center of the outer surface and a plurality of terminals arranged around the periphery of the outer surface in a substan tially equally-spaced relationship, wherein two contact terminals are arranged a long two opposed sides of the outer surface, and wherein the two contact terminals arranged along opposed sides are radio frequency input and output terminals.

28. A power amplifier, comprising:

an outer surface; and means for electrically contacting the device arranged on the outer surface including means for electrically grounding the device having a relatively large surface area arranged substantially in the center of the outer surface, and portions of the means for electrically contacting device arranged around the periphery of the outer surface in a substantially equally-spaced relationship, wherein portions of the means for electrically contacting the device are arranged along two opposed sides of the outer surface, and wherein the portions of the means for electrically contacting the device arranged along opposed sides are radio frequency input and output terminals.

* * * * *